(12) United States Patent
Kumar

(10) Patent No.: US 10,700,638 B2
(45) Date of Patent: Jun. 30, 2020

(54) SPIKE TRAIN GENERATING CIRCUIT

(71) Applicant: HEWLETT PACKARD ENTERPRISE DEVELOPMENT LP, Houston, TX (US)

(72) Inventor: Suhas Kumar, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 241 days.

(21) Appl. No.: 15/657,996

(22) Filed: Jul. 24, 2017

(65) Prior Publication Data

US 2017/0324379 A1    Nov. 9, 2017

Related U.S. Application Data

(63) Continuation-in-part of application No. 15/141,410, filed on Apr. 28, 2016, now Pat. No. 10,153,729.

(51) Int. Cl.
| | |
|---|---|
| *H03B 7/06* | (2006.01) |
| *H03B 5/04* | (2006.01) |
| *H03K 19/20* | (2006.01) |
| *H04L 27/00* | (2006.01) |

(52) U.S. Cl.
CPC ............. *H03B 7/06* (2013.01); *H03B 5/04* (2013.01); *H03K 19/20* (2013.01); *H04L 27/001* (2013.01)

(58) Field of Classification Search
CPC . H03B 7/06; H03B 5/04; H03K 19/20; H04L 27/001
USPC ............ 331/78, 117 R; 257/5; 365/100, 129, 365/148; 977/754
See application file for complete search history.

(56) References Cited

U.S. PATENT DOCUMENTS

| | | | |
|---|---|---|---|
| 7,985,962 B2 | 7/2011 | Bratkovski et al. | |
| 8,113,437 B2 | 2/2012 | Kang | |
| 8,274,813 B2 | 9/2012 | Pickett et al. | |
| 8,324,976 B2 | 12/2012 | Borghetti et al. | |
| 8,767,449 B2 | 7/2014 | Pickett et al. | |
| 2010/0084627 A1 | 4/2010 | Berger et al. | |
| 2011/0147464 A1 | 6/2011 | Kang | |
| 2011/0182107 A1 | 7/2011 | Wu et al. | |
| 2011/0182108 A1 | 7/2011 | Williams et al. | |
| 2011/0266515 A1 | 11/2011 | Pickett et al. | |
| 2014/0361851 A1 | 12/2014 | Keane et al. | |
| 2015/0008988 A1 | 1/2015 | Zidan et al. | |

OTHER PUBLICATIONS

Ascoli, A. et al., Nonlinear Dynamics of a Locally-Active Memristor, Circuits and Systems I: Regular Papers, IEEE Transactions on 62 (Apr. 2015) pp. 1165-1174.

(Continued)

*Primary Examiner* — Arnold M Kinkead
(74) *Attorney, Agent, or Firm* — Hewlett Packard Enterprise Patent Department

(57) ABSTRACT

An oscillator circuit that includes a voltage source, a resistor, a capacitor, and a nonlinear device. The capacitor and the nonlinear device may be coupled in parallel with one another. The resistor may be coupled in series with the capacitor and the nonlinear device. The voltage source may be coupled in series with the resistor. The voltage source may supply the oscillator circuit with a direct current input signal. The nonlinear device may include an active layer coupled to a first electrode and a second electrode. In response to the direct current input signal, the oscillator circuit may output a spike train including a spike bunch.

20 Claims, 13 Drawing Sheets

(56) References Cited

OTHER PUBLICATIONS

Backus, J., Can Programming be Liberated from the Von Neumann Style? A Functional Style and its Algebra of Programs, Communications of the ACM 21, (1978) pp. 613-641.
Bertschinger et al., Real-Time Computation at the Edge of Chaos in Recurrent Neural Networks, (2004) (28 pages).
Chua, L. et al., Neurons are Poised Near the Edge of Chaos, International Journal of Bifurcation and Chaos 22, 1250098 (2012) (50 pages).
Chua, L. O., Local activity is the origin of cornplexity, International Journal of Bifurcation and Chaos, 15, (2005) pp. 3435-3456.
Chua, L. O., Passivity and Complexity, Circuits and Systems I: Fundamental Theory and Applications, IEEE Transactions on 46 (1999) pp. 71-82.
Chua, L., Memristor, Hodgkin-Huxley, and Edge of Chaos, Nanotechnology 24, 383001 (2013) (14 pages).
Dogaru, R. and Chua, L. O., Edge of Chaos and Local Activity Domain of FitzHugh-Nagumo Equation, International Journal of Bifurcation and Chaos 8 (1998) (24 pages).
Driscoll et al., Chaotic Memristor, Applied physics A 102 (2011) pp. 885-889.
Esmaeilzadeh, Hadi et al., Dark Silicon and the End of Multicore Scaling, ISCA Jun. 2011 (12 pages).
Feng, Q. and He, H., Modeling of the Mean Poincare Map on a Class of Random Impact Oscillators, European Journal of Mechanics-A/Solids 22 (2003), pp. 267-281.
Junji Ohtsubo, Semconduc or Lasers: Stability, Instability and Chaos, 2013 (4 pages).
Kauffman, S. A., Requirements for Evolvability in Complex Systems: Orderly Dynamics and Frozen Components, Physica D: Nonlinear Phenomena 42, (1990) pp, 135-152.
Kennedy, Michael Peter—Three Steps to Chaos—Part II: A Chua's Circuit Primer, IEEE Transactions on Circuits and Systems, Apr. 1993 (18 pages).
Kumar et al., Local Temperature Redistribution and Structural Transition During Joule-Heating-Driven Conductance Switching in VO2. Advanced Materials 25, doi:10.1002/adma.201302046 (2013) pp. 6128-6132.
Kuznetsov, Y. A., Elements of Applied Bifurcation Theory, Second Edition, vol. 112 (Springer Science & Business Media, 2013) (614 pages).

Mikhail Prokopenko http://frontiersin.org/people/u/132401Frontiers, Grand Challenges for Computational Intelligence, Frontiers Spotlight Conference Award, 2014 (11 pages).
Pickett et al., Coexistence of Memristance and Negative Differential Resistance in a Nanoscale MetalOxideMetal System, Advanced Materials 23 (2011) pp. 1730-1733.
Pickett, M. D., et al., A Scalable Neuristor Built with Mott Memristors, Nature materials 12, doi:10.1038/nmat3510 (Dec. 2012) (4 pages).
Seifter et al., Lambda and the Edge of Chaos in Recurrent Neural Networks, Artificial Life 21 (2015) pp. 55-71.
Tian Xiao-Bo et al., Chin. Phys. B, vol. 22, No. 8, The design and simulation of a titanium oxide memristor-based programmable analog filter in a simulation program with integrated circuit emphasis, Oct. 31, 2012 (10 pages).
Wang, G. et al., A Chaotic Oscillator Based on HP Memristor Model, Mathematical in Engineering 2015 (2015) (13 pages).
Whitman et al., U.S. White House, A Nanotechnology-Inspired Grand Challenge for Future Computing, <https://www.whitehouse.gov/blog/2015/10/15/nanotechnology-inspired-grand-challenge-future-computing> (2015) (4 pages).
Wikipedia, Chua's circuitas modified on Mar. 25, 2016 (7 pages).
Wikipedia, Double pendulum last modified on Feb. 15, 2016 (6 pages).
Wikipedia, Memristor last modified on Mar. 6, 2016 (25 pages).
Wikipedia, Negative resistance last modified on Feb. 28, 2016 (37 pages).
Williams, R. Stanley et al., OSTP Nanotechnology-Inspired Grand Challenge: Sensible Machines (extended version 2.5), IEEE Rebooting Computing, Oct. 2015 (31 pages).
Wolf, A. et al., Determining Lyapunov Exponents from a Time Series, Physica D: Nonlinear Phenomena 16 (1985) pp. 285-317.
Zidan, M.A. et al., A Family of Memristor-based Reactance-less oscillators, Apr. 11, 2013 (22 pages).
Itoh, M., et al.; "Memristor Oscillators"; Jul. 15, 2008; 24 pages.
Muthuswamy, B., et al.; "Memristor Based Chaotic Circuits"; Nov.-Dec. 2009; 16 pages.
Pershin, Y. V., et al.; "Practical approach to programmable analog circuits with memristors", Aug. 2009; 8 pages.
Sun, W., et al.; "A Memristor Based Chaotic Oscillator"; Jun. 10, 2009; 3 pages.
Dambre et al., "Information Processing Capacity of Dynamical Systems", Scientific Reports vol. 2, Article No. 514, 2012, 7 pages.

US 10,700,638 B2

SPIKE TRAIN GENERATING CIRCUIT

RELATED APPLICATION

This application is a continuation-in-part of U.S. patent Ser. No. 10/153,729 filed 28 Apr. 2016.

BACKGROUND

Oscillator circuits output a periodic signal. Certain types of oscillator circuits, including Pearson-Anson oscillators, receive a direct current input signal and output a periodic signal (e.g. a square wave, a sawtooth wave). Pearson-Anson oscillators consist of a resistor in series with a capacitor that is in parallel with a switching device. Many Pearson-Anson oscillators include an inert gas tube (e.g. a neon light tube) as the switching device. Pearson-Anson oscillators accumulate charge from the direct current input signal on the capacitor. As the voltage across the capacitor grows, the inert gas tube does not allow significant amounts of current to flow. Once the voltage across the capacitor (and, consequently, the voltage across the inert gas tube) reaches a breakdown voltage of the inert gas tube, the inert gas tube activates (e.g. the light turns on), and current is able to flow across the inert gas tube. As the charge on the capacitor discharges, the voltage across the inert gas tube reduces to an extinction voltage, at which the inert gas tube deactivates (e.g. the light turns off), and current is no longer substantially able to flow across the inert gas tube. This alternating pattern of activation and deactivation of the inert gas tube results in a periodic signal being output.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

it is appreciated that certain examples described herein below have features that are in addition to or in lieu of the features illustrated in the above-referenced figures.

DETAILED DESCRIPTION

Chaotic Oscillator

As advancement in increasing the density of active elements in an integrated circuit device, such as a processor, memory device, and so forth, has slowed, designers and manufacturers of electronic devices are facing a bottleneck in producing devices that are able to meet the increasing demands for processing and storage capacities.

To address the foregoing issues, alternative electronic systems that rely on chaotic behavior can be employed. Chaos can refer to the extreme sensitivity of a system's behavior to very small changes to its input. Examples of electronic systems that exhibit chaotic behavior include those that employ system-level components (such as discrete integrated circuit devices, discrete resistors and capacitors, etc.) to achieve a design that provides chaotic behavior under certain conditions. However, system-level components can be expensive to use and can have high power consumption.

In accordance with some implementations of the present disclosure, a nano-scale oscillator is provided that exhibits chaotic oscillation responsive to a control input to the nano-scale oscillator. The control input includes a tunable input parameter. Note that a control input including a tunable input parameter can refer to a control input that includes a single tunable input parameter, or multiple tunable input parameters. A tunable input parameter refers to an input parameter that can be adjusted by a control entity to change the behavior of the nano-scale oscillator. Examples of tunable input parameters (which can be dynamically adjusted or varied during operation of a device that includes the nano-scale oscillator) include an input voltage, an input current, a resistance, and temperature. In other examples, parameters such as dimensions of the device and materials used in the nano-scale oscillator can control the chaotic behavior of the nano-scale oscillator.

An oscillator can refer to an electronic circuit that produces an oscillating signal during operation of the electronic circuit. An oscillator that exhibits chaotic oscillation can refer to an oscillator that produces an oscillating signal that has irregular variations to changes in input to the oscillator. A nano-scale oscillator or other type of component can refer to a component that has dimensions in the nanometer (nm) range, such as a dimension that is less than 1 micrometer. More specifically, in some examples, a nano-scale component can have dimensions each less than 500 nm, or less than 100 nm, and so forth.

Figure 1:
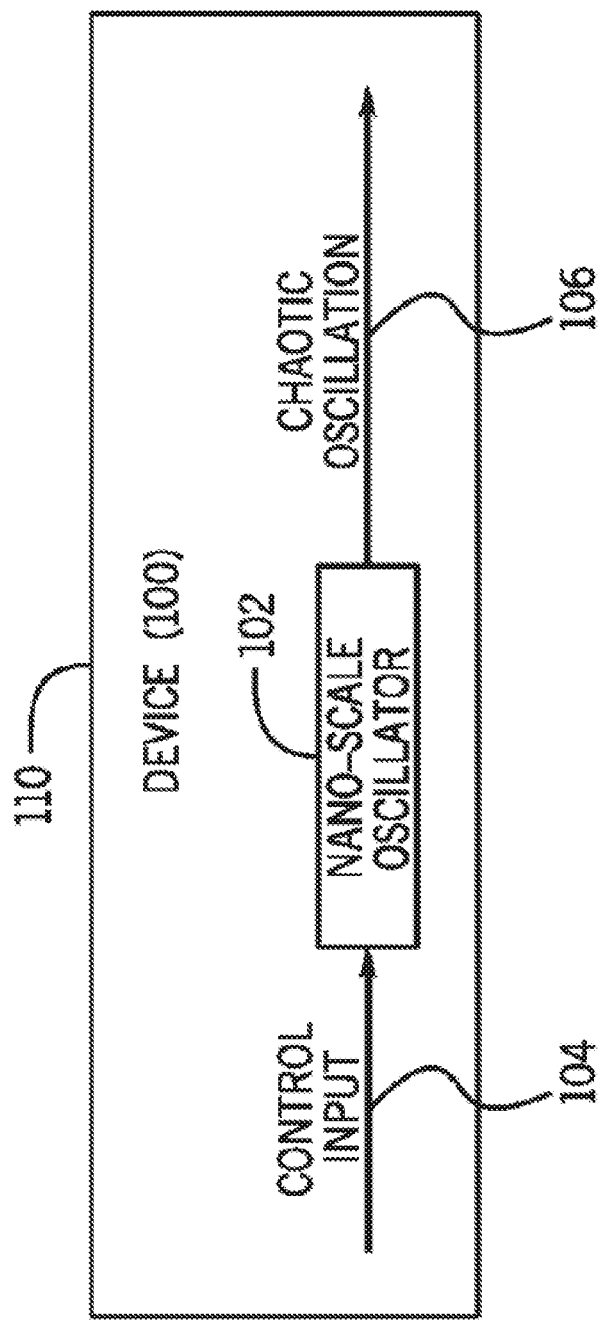
FIG. 1 is a block diagram of a device including a nano-scale oscillator according to some examples.

FIG. 1 shows an example device 100, which can be an integrated circuit (IC) device formed using solid state manufacturing techniques. Solid state manufacturing can refer to a manufacturing technique in which successive layers of materials are formed on a substrate (e.g. a silicon substrate or other semiconductor substrate), with each layer subjected to patterning to form target structures, such as those for transistors, storage cells, or other electronic elements. Such a substrate can be represented as 110 in FIG. 1.

The device 100 includes a nano-scale oscillator 102. Although just one nano-scale oscillator 102 is shown in FIG. 1, it is noted that the device 100 can include multiple nano-scale oscillators 102. The device 100 including one nano-scale oscillator 102 or multiple nano-scale oscillators can form a building block for a larger electronic system, such as a computer system, a storage system, a communication system, and so forth.

As examples, the electronic system can be used to perform any or some combination of the following operations: encrypting and/or decrypting data, encoding and/or decoding data, performing a cryptographic operation, computing a solution for a set of equations, generating random or pseudo-random numbers, communicating information in a network, performing machine learning, performing operations of a neural network, or other operations.

The chaotic behavior of the nano-scale oscillator 102 according to some implementations can be used to increase the computation and storage capacity of an electronic system, as compared to electronic systems that rely on the ordered behavior of electronic components. In this manner, devices that include the nano-scale oscillators according to some implementations can be used to meet the increasing demands for computation and storage capacity.

The nano-scale oscillator 102 receives a control input 104, which can include a tunable input parameter or multiple tunable input parameters. A tunable input parameter can be controlled (i.e. the input parameter can be settable to any of various different values) by an entity that is external of the device 100 or that is part of the device 100. The control input 104 can be controlled electronically, such as by a hardware processing circuit or a combination of machine-readable instructions executable on the hardware processing circuit.

When the tunable input parameter(s) is (are) set to a value that is within a specified range (or specified ranges), the nano-scale oscillator 102 can be caused to exhibit chaotic oscillation (i.e. outputs an oscillating signal 106 that exhibits chaotic behavior by having chaotic oscillation). The nano-scale oscillator 102 can include a chaotic regime and a non-chaotic regime (or ordered regime). In the ordered or non-chaotic regime, the nano-scale oscillator 102 does not exhibit chaotic behavior. The nano-scale oscillator 102 is placed in the chaotic regime in response to the input parameter(s) being set to within a specified range(s). When the input parameter(s) is (are) set to outside the specified range(s), then the nano-scale oscillator 102 exhibits non-chaotic (or ordered) behavior.

It is noted that chaotic behavior of the nano-scale oscillator 102 is deterministic based on a set of equations that characterize the behavior of the nano-scale oscillator 102. Thus, the irregular oscillations (i.e. chaotic oscillations) of the nano-scale oscillator 102 are not random—rather, they can be determined so long as the initial state of the nano-scale oscillator 102 is known and the set of equations characterizing the behavior of the nano-scale oscillator 102 is known.

Reference to the chaotic oscillation of the nano-scale oscillator 102 can refer to the chaotic oscillation within the chaotic regime of the nano-scale oscillator 102, or at the edge of the chaotic regime, where the edge of the chaotic regime can refer to the line that divides the ordered regime and the chaotic regime of the nano-scale oscillator 102.

Figure 2:
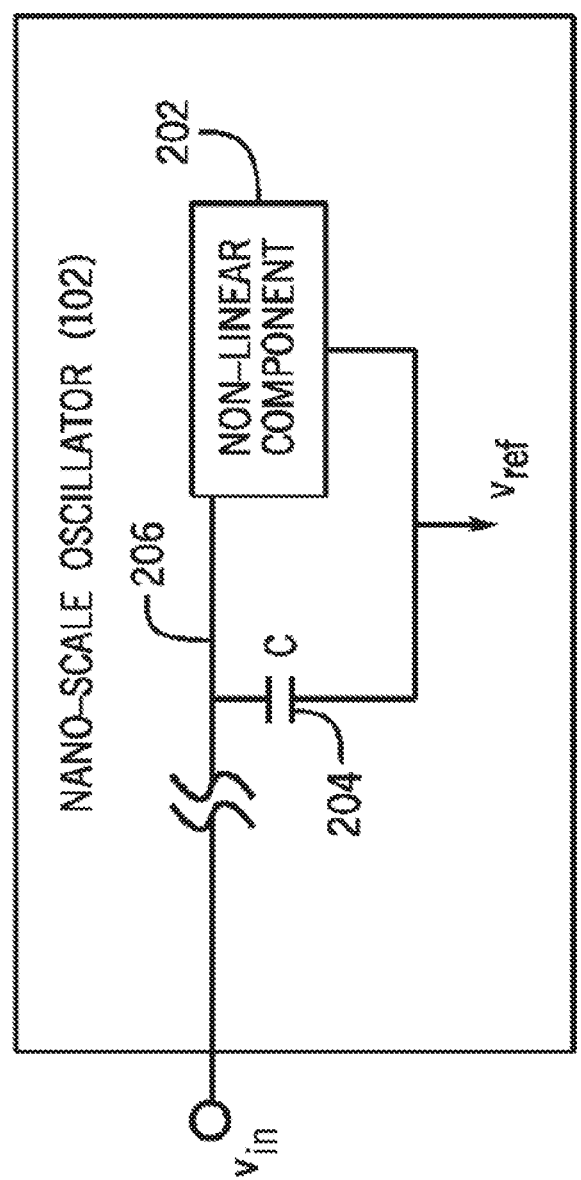
FIG. 2 is a block diagram of a nano-scale oscillator according to some examples.

FIG. 2 is a schematic diagram of an example nano-scale oscillator 102 according to some examples. The nano-scale oscillator 102 includes a non-linear component 202 that exhibits a non-linear response to an input parameter. In some examples, the non-linear component can exhibit a non-linear response to temperature, or some other parameter, or a combination of parameters. In some examples, the non-linear response includes a negative differential resistance (NDR). NDR is a property of a component where an increase in current through the component results in a decreased voltage across the component in a specific region of operation (e.g. where the specific region of operation can include a specific range of current through the component).

In other examples, the non-linear response is a negative differential capacitance or negative differential inductance.

As explained further below, the non-linear component 202 can exhibit NDR in multiple regions (or regimes) of operation of the non-linear component 202. More generally, the non-linear component 202 can exhibit a non-linear response in multiple negative differential response regimes.

A parallel capacitor 204 in the nano-scale oscillator is connected to the non-linear component 202. A first terminal of the parallel capacitor 204 is connected to a reference voltage v_ref, such as ground or another reference voltage. A terminal of the non-linear component 202 is also connected to the reference voltage v_ref. A second terminal of the capacitor 204 is connected to a node 206 that is connected to another terminal of the non-linear component 202. The terminal 206 can be connected through a resistor to an input voltage v_in to the nano-scale oscillator 102.

The parallel capacitor 204 is used as an energy storing element, to allow the combination of the non-linear component 202 and the capacitor 204 to oscillate under certain conditions.

If the nano-scale oscillator 102 is to be operated in the chaotic regime or at the edge of the chaotic regime, then the input voltage, v_in, can be set to a value that is within a specific range (or within one of multiple specific ranges), to cause chaotic oscillation of the nano-scale oscillator 102. On the other hand, if the nano-scale oscillator 102 is to be operated in the ordered regime, then the input voltage, v_in, can be set to a value that is outside the specific range (or outside the multiple specific ranges), to cause ordered oscillation of the nano-scale oscillator 102.

Figure 3:
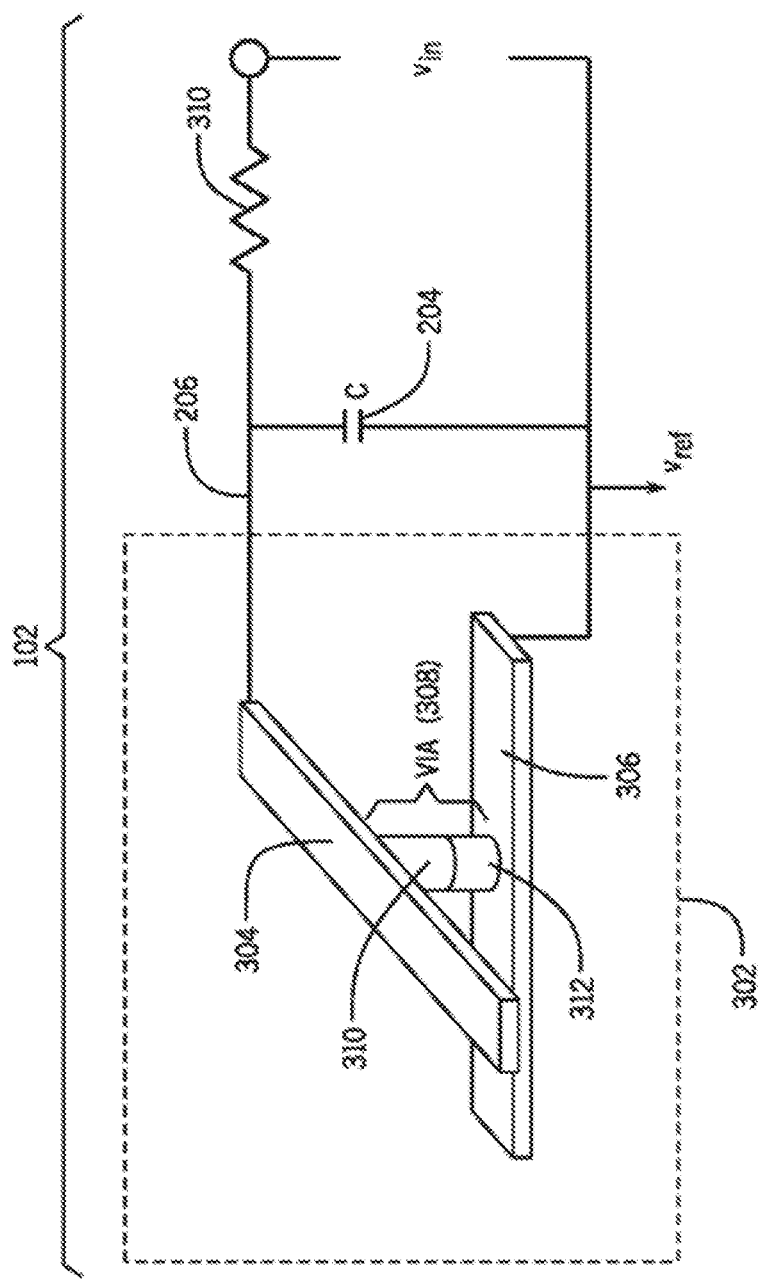
FIG. 3 is a block diagram of a nano-scale oscillator including a memristor, in accordance with some examples.

FIG. 3 is a schematic diagram of a nano-scale oscillator 102 according to further specific examples. In examples according to FIG. 3, the non-linear component 202 of FIG. 2 is a memristor 302, which can exhibit NDR. A memristor 302 is an electronic component that is programmable to different resistive states (e.g. between a high resistance state and a low resistance state) in response to input energy (e.g. a voltage or current) provided to the memristor.

The memristor 302 can exhibit NDR in multiple regimes, due to the high non-linear temperature dependence of resistance of the memristor 302. In some examples, the nano-scale oscillator 102 according to FIG. 3 is a Pearson-Anson oscillator including the memristor 302 according to some examples. The memristor 302 includes an upper electrode 304 and a lower electrode 306. The upper and lower electrodes 304 and 306 are electrical conductors. In some examples, a via 308 interconnects the upper electrode 304 and the lower electrode 306. The via 308 can include a first via portion 310 and a second via portion 312. The upper electrode 304 provides the oscillation signal 106 depicted in FIG. 1.

In some examples, the first via portion 310 includes a material such as niobium oxide, vanadium oxide, or another material. More generally, the first via portion 310 includes a material that exhibits a voltage controlled insulator/conductive phase of transformation, such that a relatively sharp metal-insulator transition (MIT) can be provided.

The second via portion 312 includes a material such as titanium nitride (TiN), hafnium nitride (HfN), or another material.

The upper electrode 304 can be formed of a metal, such as platinum or other type of metal, or any other type of electrically conductive material. The lower electrode 306 can be formed of a metal, such as tungsten (W), or any another type of metal, or any other electrically conductive material.

The diameter of the via 308 can be less than 100 nm in some examples. The via 308 may be etched through a layer of insulating silicon oxide (SiO2) to provide mechanical stability and electrical isolation from neighboring devices.

The capacitor 204 is connected in parallel with the memristor 302, where the first terminal of the capacitor 204 is connected to the upper electrode 304 of the memristor 202, and the second terminal of the capacitor 204 is connected to the lower electrode 306 of the memristor 302. The second terminal of the capacitor 204 and the lower electrode 306 of the memristor 302 are connected to the reference voltage v_ref. The node 206 to which the first terminal of the capacitor 204 is connected is coupled through a series resistor 310 to the input voltage v_in.

Although the capacitor 204 is shown as being separate from the memristor 302, it is noted that in other examples, the capacitor 204 can represent an integrated capacitance that is part of the memristor 302. This integrated capacitance can be provided between the electrodes 304 and 306. By using the integrated capacitance, a separate component can be omitted in the nano-scale oscillator 102.

Figure 4A:
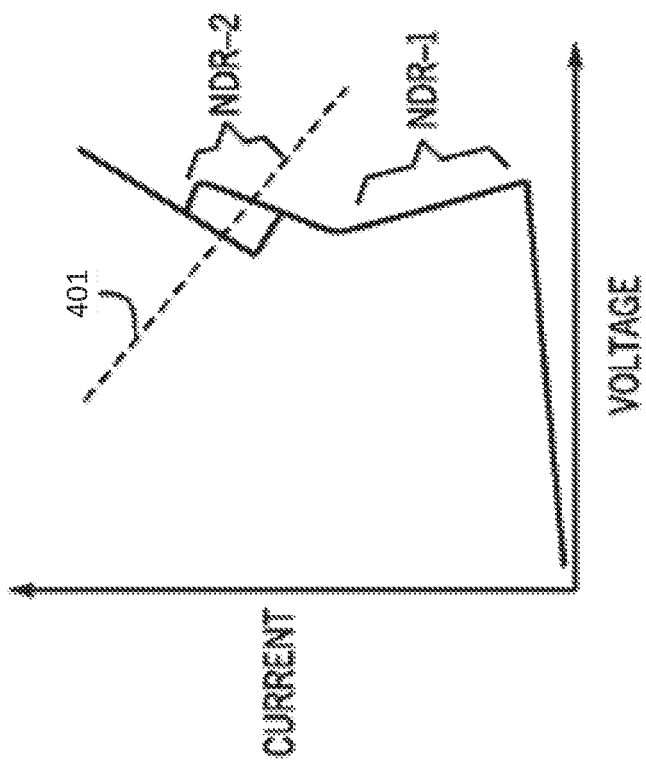
FIG. 4A is a voltage-current plot of a behavior of a non-linear device of a nano-scale oscillator according to some examples.

FIG. 4 shows an example of a quasi-static current-voltage plot depicting a behavior of the memristor 302 according to some examples. The current-voltage plot of FIG. 4 is obtained by sweeping the current through the memristor 302. As shown by FIG. 4, the memristor 302 exhibits multiple regions of current-controlled NDR, depicted as NDR-1 and NDR-2 in FIG. 4. The memristor 302 exhibits a first region of current-controlled NDR (NDR-1) at lower currents (a first range of electrical currents), and a second region of current-controlled NDR (NDR-2) at higher currents (a second, different range of electrical currents). The second region of current-controlled NDR (NDR-2) actually includes a pair of NDR responses that form a hysteresis loop (a box-like response as shown in FIG. 4).

In some examples, the following set of equations (Eqs. 1-5) characterize the behavior of the memristor 302, with temperature (T) as the order parameter (state variable).

$$i_m = \left[A\sigma_0\left(\frac{k_B T}{\beta\sqrt{v_m}}\right)^2\left\{1+\left(\frac{\beta\sqrt{v_m/t}}{k_B T}-1\right)e^{\frac{\beta\sqrt{v_m/t}}{k_B T}}\right\}+\frac{A\sigma_0(T)/t}{2}\right]v_m.$$ (Eq. 1)

$$\sigma_0(T) = 2\times 10^4 e^{-\frac{0.301}{k_B T}}.$$ (Eq. 2)

$$\frac{dT}{dt} = \frac{i_m v_m}{C_{th}} - \frac{T-T_{amb}}{C_{th}R_{th}(T)} + \eta(T).$$ (Eq. 3)

$$R_{th}(T) = 1.4\times 10^6 \text{(for } T \le T_C\text{) and } 2\times 10^6 \text{(for } T > T_C\text{).}$$ (Eq. 4)

$$\eta(T) = T\left(\frac{k_B}{C_{th}}\right)^{\frac{1}{2}}\frac{4\pi}{R_{th}C_{th}} \text{ rand }(-1 \leftrightarrow 1).$$ (Eq. 5)

In the above equations, v_m is the voltage across the memristor 302; i_m is the current through the memristor 302, written in the form i_m=[G(v_m,T)]v_m, where G(v_m,T) is the memductance of the memristor 302; β is a constant=2.6×10$^{-24}$ in some examples; T is the temperature in Kelvins (K); T_amb is the ambient temperature; C_th is the thermal capacitance; η(T) is the thermal perturbation; rand(−1⇆1) is a random real number between −1 and 1; k_B is the Boltzmann constant; R_th (T) is a temperature dependent thermal resistance that undergoes an abrupt change at the critical temperature T_C=1,100 K; and t represents time.

Eq. 3 is an equation of state describing the dynamic behavior of temperature in relation to the electrical power and thermal properties of the memristor 302, represented by C_th and R_th (T). More specifically, C_th and R_th (T) are the effective thermal capacitance and thermal resistance, respectively, between the electrically active portion of the via portion 310 (formed of niobium oxide for example) and its ambient environment.

By including a series resistance, R_S (which is the resistance of the resistor 310 in FIG. 3), Eq. 3 is modified to $$\frac{dT}{dt} = \frac{(v_{in} - i_m R_S)i_m}{C_{th}} - \frac{T-T_{amb}}{R_{th}C_{th}} \text{(neglecting noise),}$$ (Eq. 6)

where v_in is the DC input voltage across the series combination of R_S and the memristor 302.

Given a constant DC input voltage, v_in, and the series resistance, R_S, a region of operation can be defined for the nano-scale oscillator 102, where this region of operation is represented by a load line 401 in FIG. 4. The load line 401 passes through NDR-2 in FIG. 4, which corresponds to a region of operation of the nano-scale oscillator 102 that exhibits chaotic oscillation.

In some examples, to access chaotic behavior in the nano-scale oscillator 102, three features of the nano-scale oscillator 102 are present. First, the nano-scale oscillator 102 has dimensions in the nano-scale range, e.g. less than 100 nm or other values as listed further above. Using the nano-scale oscillator 102 with dimensions in the nano-scale range decreases the thermal capacitance (C_th), thereby increasing the memristor's sensitivity to thermal noise (as expressed by Eqs. 3 and 5).

Second, the nano-scale oscillator 102 has multiple NDR regions, as shown in FIG. 4, so that Eq. 3 has multiple equilibrium regions. FIG. 5 is a plot of dT/dt (as expressed by Eq. 3) to temperature (T). For a given DC input voltage, dT/dt exhibits three equilibrium regions 502, 504, and 506 in three different temperature (T) ranges, with the middle equilibrium region 504 being unstable and the equilibrium regions 502 and 506 on the two sides of the equilibrium position 504 being stable. The presence of a high-energy (unstable) equilibrium region 504 flanked by stable equilibrium regions is a fingerprint of local activity that gives rise to NDR, such that chaotic behavior can be exhibited. Thus, the nano-scale oscillator 102 has a response that includes an unstable region flanked by stable regions in any operating space (where an operating space can be defined by values of one or multiple parameters, such as voltage, current, etc.) for different temperatures.

Third, the nano-scale oscillator 102 includes two NDR regions NDR-1 and NDR2 (FIG. 4) at approximately the same voltage range (as shown in FIG. 4). As a result, the nano-scale oscillator 102 can be pushed into chaos by small oscillatory forces like thermal noise.

Figure 6:
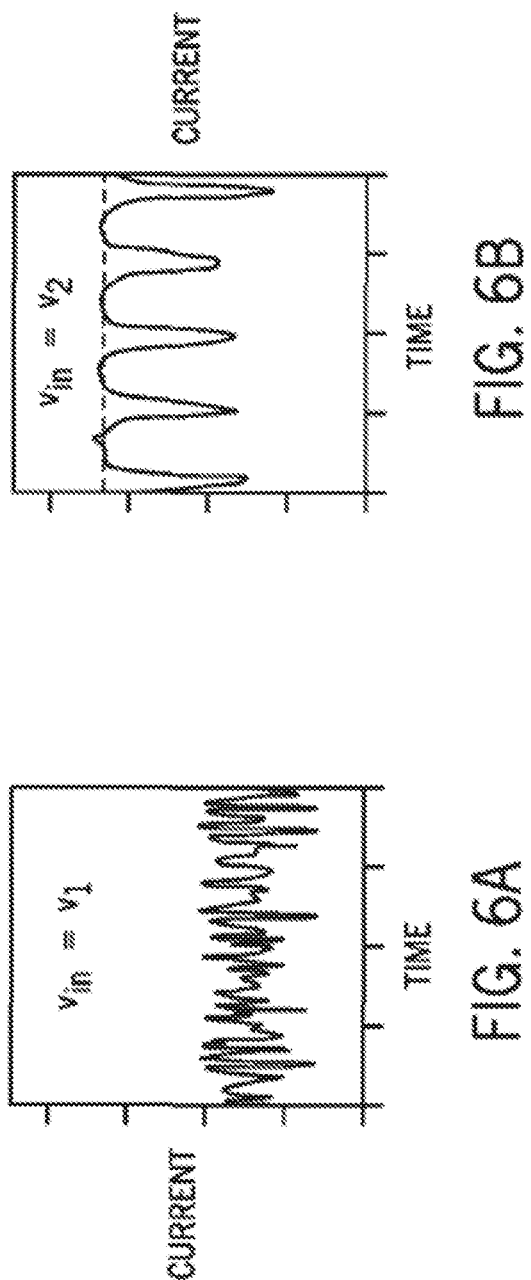
FIGS. 6A and 6B are plots of oscillating signals in the chaotic regime and ordered regime of a nano-scale oscillator, respectively, according to some examples.

FIGS. 6A and 6B illustrate two different oscillations (current as a function of time) of the oscillating signal 106 (FIG. 1) produced by the nano-scale oscillator 102 according to some examples. FIG. 6A shows chaotic oscillation in response to a first value (v_1) of the input voltage v_in (which causes chaotic behavior of the nano-scale oscillator 102), and FIG. 6B shows ordered oscillation in response to a second, different value (v_2) of the input voltage v_in (which causes ordered behavior of the nano-scale oscillator 102).

Figure 7:
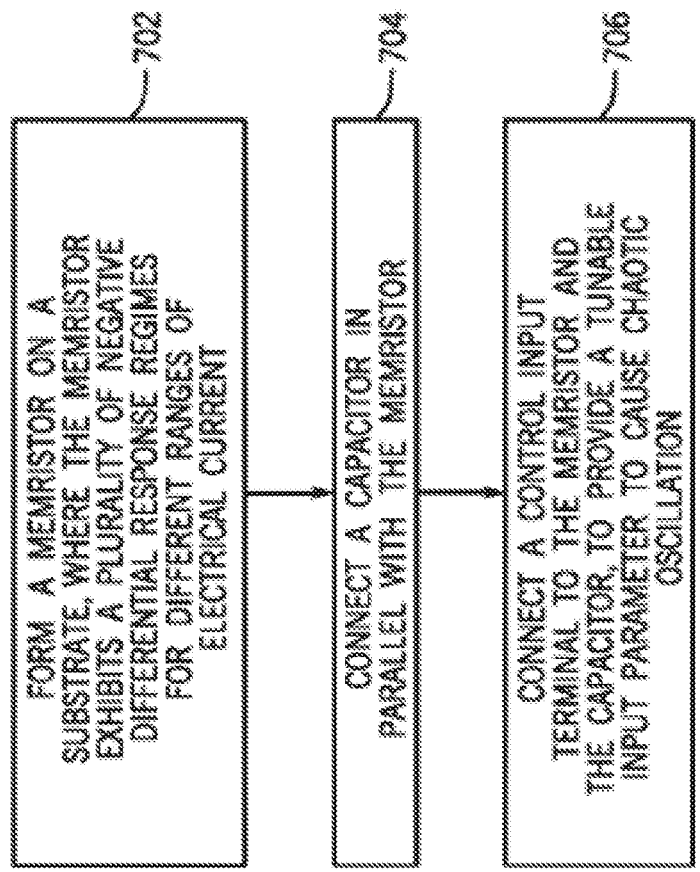
FIG. 7 is a flow diagram of a process of forming a device, according to some examples.

FIG. 7 is a flow diagram of a process of forming a device according to some examples. The process includes forming (at 702) a memristor on a substrate, wherein the memristor exhibits a plurality of negative differential response regimes for different ranges of electrical current. The process further includes connecting (at 704) a capacitor in parallel with the memristor, and connecting (at 706) a control input terminal (e.g. the terminal of the nano-scale oscillator 102 through which the control input 104 is provided) to the memristor and the capacitor, to provide a tunable input parameter to the memristor and the capacitor to cause chaotic oscillation. The control input terminal can be connected to the memristor and capacitor through a series resistor. In some examples, the parallel capacitor can be separate from the memristor. In other examples, the parallel capacitor may be a capacitance integrated into the memristor, where the integrated capacitance can be between the electrodes of the memristor.

Action Potential Oscillator

Some example oscillator circuits may be configured to output a signal substantially similar to an action potential generated by biological neurons. In a biological neuron, ions are transported across a membrane to generate charges, which result, under certain circumstances, in a current spike called an action potential. Example oscillator circuits that output action potentials (i.e. signals substantially similar to an action potential generated by biological neurons) may receive an input signal that causes the oscillator circuit to output an action potential. Certain example Pearson-Anson oscillator circuits may output an action potential based on a direct current input signal.

Certain example Pearson-Anson oscillators include a second-order memristor. The second-order memristor may have a variable resistance based on both an input current and an operating temperature. In some examples, the second-order memristor includes an active layer that is coupled between two electrodes. In some examples, the second-order memristor exhibits regions on its current-voltage (IV) curve of negative differential resistance (NDRs) in response to certain patterns of input current. For example, in an NDR region, as the input current increases, the voltage across the second-order memristor may decrease.

Within an example Pearson-Anson oscillator, an example second-order memristor may act as a nonlinear switching device, when placed in parallel with a capacitor. For example, a direct current input signal may accumulate a charge on the capacitor, inducing a voltage across the capacitor, and consequently across the second-order memristor. In certain of such examples, the second-order memristor may substantially prevent current from flowing while the voltage across the capacitor is less than a breakdown voltage, and once the breakdown voltage is surpassed, the second-order memristor may allow current to flow while the voltage across the capacitor is greater than an extinction voltage. In some examples, the Pearson-Anson oscillator containing the second-order memristor outputs a spike train. The spike train may be a signal that includes one or more spike bunches separated by a substantially constant current signal of a substantially consistent duration. Each spike bunch may be a signal including one or more current spikes in rapid succession. A current spike may be a substantial change in the current of the signal followed by a return to a baseline current value.

Figure 8:
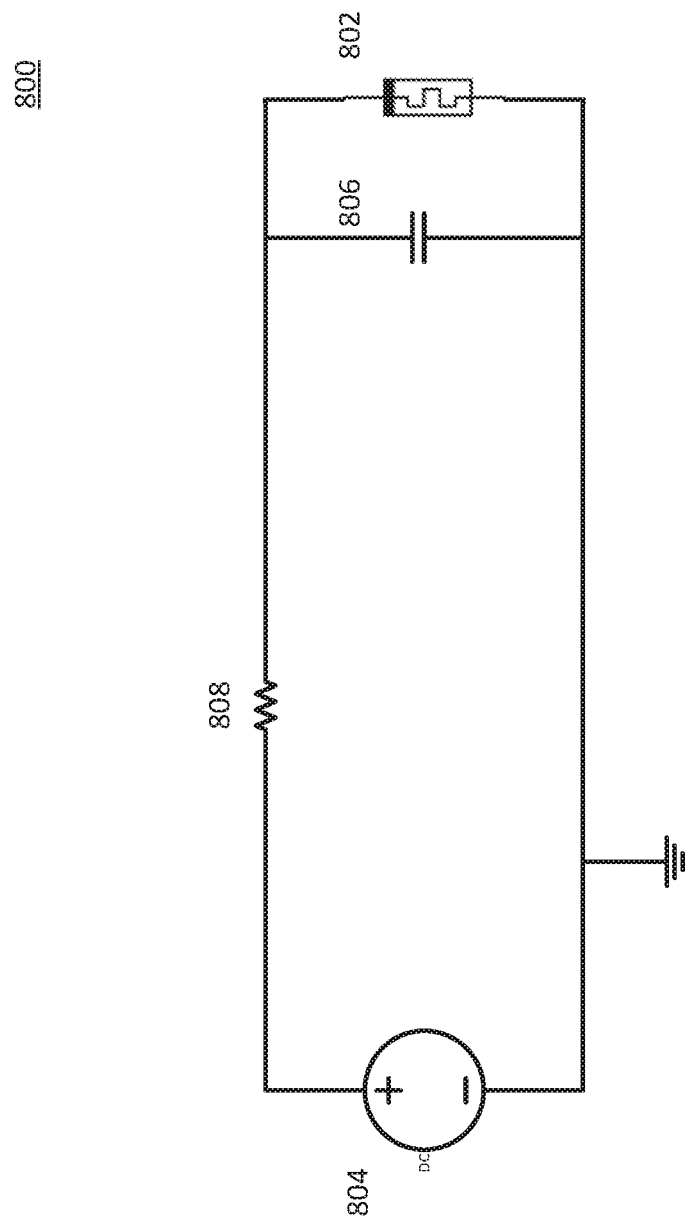
FIG. 8 illustrates an example spike train generating oscillator circuit.

In FIG. 8, an example oscillator circuit is illustrated. In some examples, oscillator circuit 800 includes a nonlinear device 802. Nonlinear device 802 may be a second-order memristor that has a variable resistance based on a first operating parameter and a second operating parameter. In certain examples, the variable resistance of the second-order memristor is based on a current through nonlinear device 802 and a temperature of nonlinear device 802. In some examples, the current-voltage (IV) curve of nonlinear device 802 exhibits regions of negative differential resistance (NDRs). NDRs of nonlinear device 802 may be regions where change in current through nonlinear device 802 is inversely related to change in voltage across nonlinear device 802.

The IV curve of nonlinear device 802 may be a hysteresis curve, wherein in certain regions of the IV curve, a previous value of the current through nonlinear device 802 may affect the voltage across nonlinear device 802 for a certain present value of the current through nonlinear device 802. For example, when the current through nonlinear device 802 decreases to a certain value, the voltage across nonlinear device 802 may be a first voltage, and when the current through nonlinear device 802 increases to the certain value, the voltage across nonlinear device 802 may be a second voltage, different from the first voltage. In some examples, certain regions of the IV curve may exhibit an NDR when current is changing in a first direction (for example, increasing), but the certain regions of the IV curve may not exhibit an NDR when current is changing in a second direction (for example, decreasing). In certain of those examples, oscillations of oscillator circuit 800 are driven by these NDR containing regions of hysteresis on the IV curve of nonlinear device 802.

In some examples, oscillator circuit 800 is powered by voltage source 804. Voltage source 804 may provide a direct current input signal to oscillator circuit 800. In some examples, the voltage of the direct current input signal dictates how many current spikes are contained in each spike bunch of the spike train. For example, when the direct current input signal is at a first voltage, each spike bunch may contain a first number of current spikes, and when the direct current input signal is at a second voltage, each spike bunch may contain a second number of current spikes. In some example oscillator circuits 800, the number of current spikes per spike bunch for each voltage of the direct current input signal may vary around an average number, rather than each spike bunch for a certain input signal voltage containing the exact same number of current spikes.

In some examples, nonlinear device 802 is coupled in series with voltage source 804 and coupled in parallel with a capacitor 806. During operation, capacitor 806 may accumulate charge, resulting in a voltage across capacitor 806. In some examples, since nonlinear device 802 is coupled in parallel with capacitor 806, the voltage across capacitor 806 is the same as the voltage across nonlinear device 802. Resistor 808 may be coupled in series with capacitor 806 and nonlinear device 802, dividing the input voltage. In some examples, resistor 808 and capacitor 806 are sized so that oscillator circuit 800 is capable of outputting action potentials. In some other examples, resistor 808 and capacitor 806 may be sized so that oscillator circuit 800 outputs a chaotic signal. In yet other examples, resistor 808 and capacitor 806 may be sized to produce a periodic signal (e.g. a sawtooth wave, a square wave).

In operation, an example voltage source 804 of oscillator circuit 800 may provide a direct current input signal that accumulates charge on capacitor 806. The accumulation of charge on capacitor 806 increases the voltage across capacitor 806 based in part on the RC time constant of the circuit. The increasing voltage across capacitor 806 may correspond to an increasing voltage across nonlinear device 802. Nonlinear device 802 may have two operating states: a nonconducting state and a conducting state. In some examples, when nonlinear device 802 is in the nonconducting state, current is substantially prevented from flowing through nonlinear device 802.

When nonlinear device 802 is in the nonconducting state and the voltage across capacitor 806 increases beyond a trigger voltage (also called a breakdown voltage), nonlinear device 802 may transition to the conducting state and current may be allowed to flow across nonlinear device 802. When nonlinear device 802 is in the conducting state and the voltage across capacitor 806 decreases below an extinction voltage, nonlinear device 802 may transition to the nonconducting state and current may be substantially prevented from flowing across nonlinear device 802. In some examples, the trigger voltage is greater than the extinction voltage. In certain examples, oscillator circuit 800 is tuned to oscillate in a way to generate a spike train (i.e. components are sized and configured such that the output of oscillator circuit 800 is a spike train).

Figure 4B:
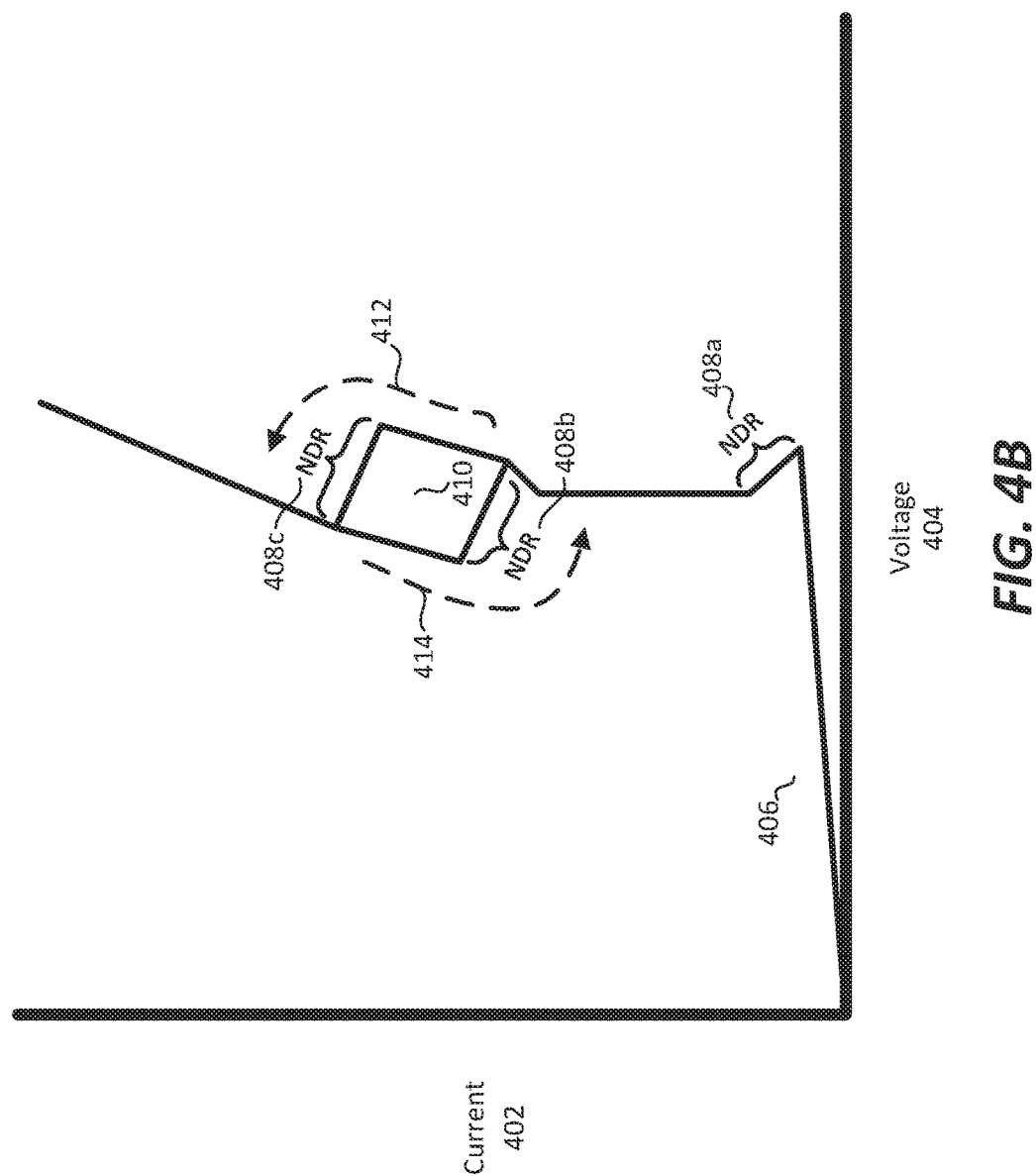
FIG. 4B is a voltage-current plot illustrating additional detail of a behavior of an example non-linear device.
Figure 5:
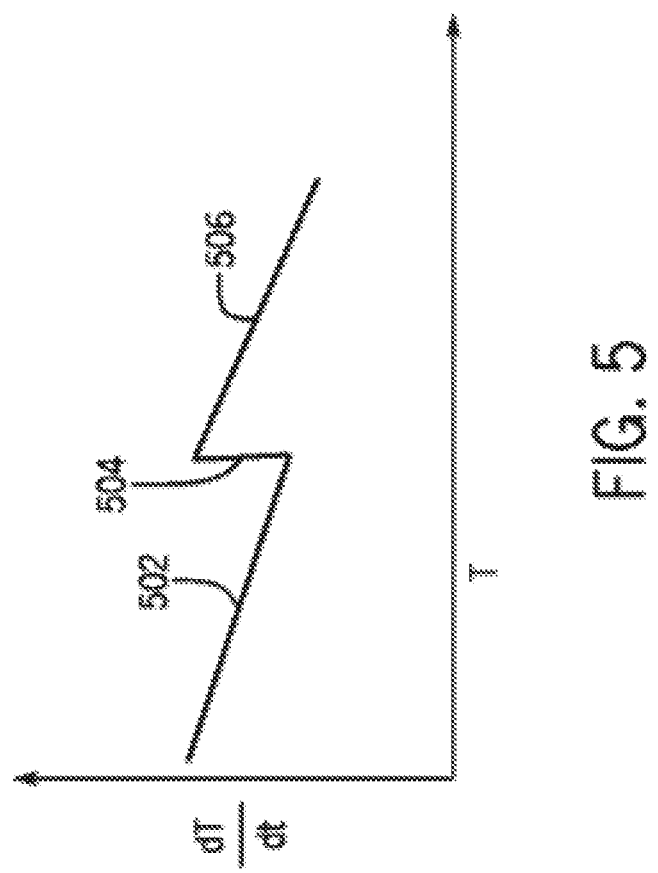
FIG. 5 is a plot of temperature to a differential of temperature with respect to time, of a behavior of a nano-scale oscillator according to some examples.

In FIG. 4B, an example chart is illustrated showing a current-voltage (IV) curve of a nonlinear device. Chart 400 contains a vertical axis corresponding to current 402 through the nonlinear device. Chart 400 also contains a horizontal axis corresponding to voltage 404 across the nonlinear device. Chart 400 further contains an example IV curve 406 that may indicate the relationship between current 402 through the nonlinear device and voltage 404 across the nonlinear device.

In some examples, IV curve 406 contains regions of negative differential resistance (NDRs) 408. NDRs 408 may be regions of IV curve 406 where current 402 is inversely related to voltage 404. An NDR 408*a* may be located outside a hysteresis region 410, wherein voltage 404 at a certain current 402 is the same whether current 402 is increasing or decreasing. NDRs 408*b-c* may be located within a hysteresis region 410, wherein voltage 404 at a certain current 402 is different based on whether current 402 is increasing or decreasing. For example, an increasing current 402 through hysteresis region 410 may follow one path 412 along IV curve 406, whereas a decreasing current 402 through hysteresis region 410 may follow a different path 414 along IV curve 406. In some examples, both paths 412 and 414 contain NDRs (408*c* and 408*b*, respectively).

Figure 9:
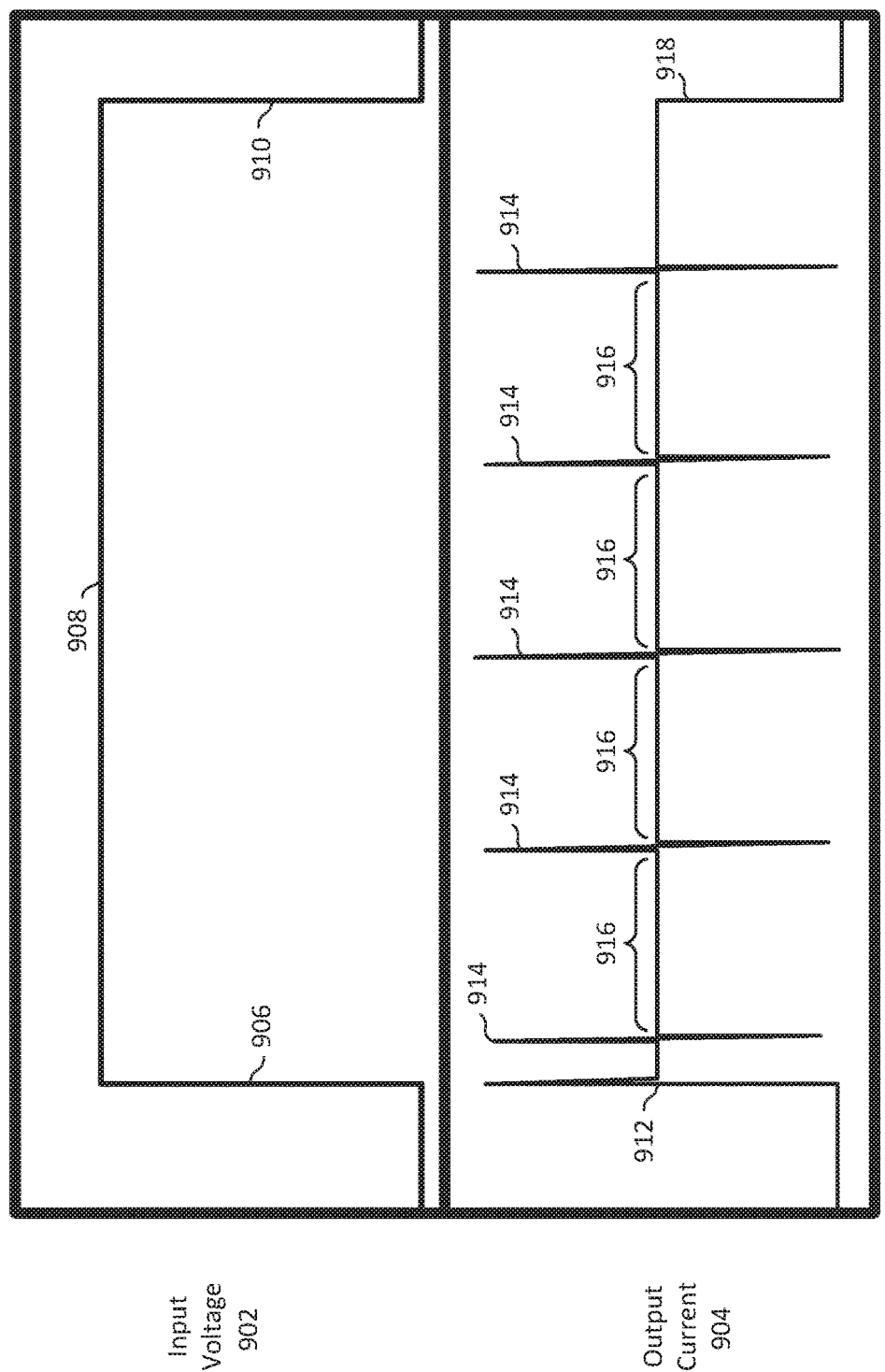
FIG. 9 is a graph illustrating an input voltage and an output current of an example oscillator circuit exhibiting a spike train.

In FIG. 9, an example graph is illustrated showing an input voltage and an output current of an example oscillator circuit. Graph 900 illustrates an input voltage 902 on top and an output current 904 on bottom. In some example oscillator circuits, a direct current input signal is input into the circuit, and a spike train is output from the circuit. An example direct current input signal is illustrated as input voltage 902. Input voltage 902 may include an initial rise 906 to an operating voltage 908 followed by a shutdown fall 910 to a shutdown voltage (e.g. zero volts).

In response to an example direct current input signal, an example oscillator circuit may output a spike train. In some examples, output current 904 contains an initial spike 912 corresponding to initial rise 906 of input voltage 902. Output current 904 may then exhibit a series spike bunches 914 including a number of current spikes. In the example illustrated in FIG. 9, three is one current spike per spike bunch 914. In some examples, a current spike is a rapid change of output current relative to a stable current value, followed by a rapid change of output current in the opposing direction, followed by a return to the stable current value. Spike bunch 914 may include multiple current spikes. In some examples, the magnitude of operating voltage 908 determines a number of current spikes included in each spike bunch 914. Spike bunches 914 are separated from one another by spike interval 916. In some examples, spike interval 916 is measured from the first current spike of a spike bunch 914 to the first current spike of a successive spike bunch 914. Each spike interval 916 of the spike train may be of substantially similar durations to one another; in other words, spike bunches 914 may repeat substantially periodically. In some examples, each spike interval 916 is a signal of a certain duration with substantially constant current over the duration. In some examples, the duration of spike interval 916 is based in part on a value of a capacitor and a value of a resistor of the oscillator circuit.

Figure 10:
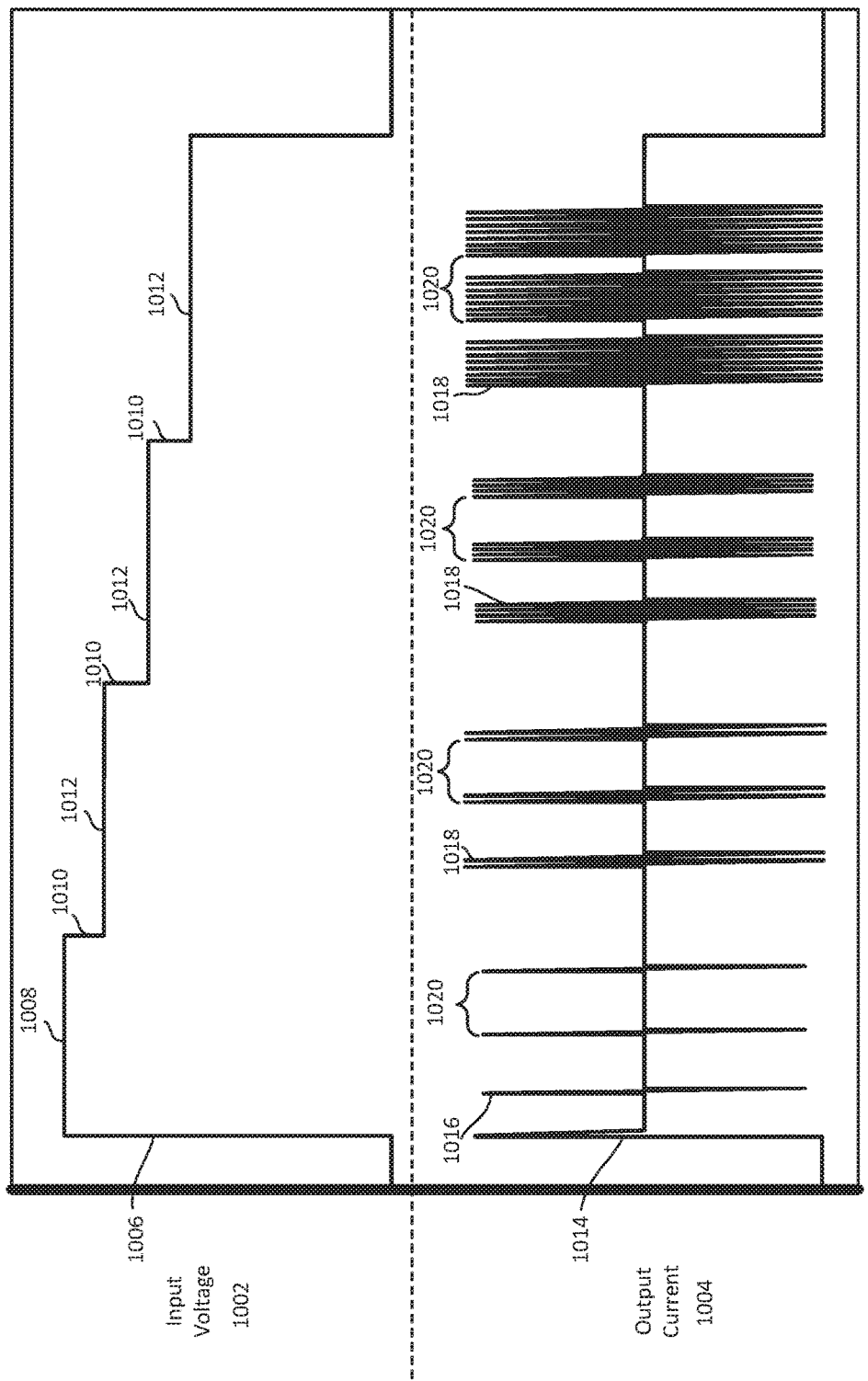
FIG. 10 is a graph illustrating an input voltage and an output current of an example oscillator circuit exhibiting spike bunches.

In FIG. 10, another example graph is illustrated showing an input voltage and an output current of an example oscillator circuit. Graph 1000 illustrates an input voltage 1002 on top and an output current 1004 on bottom. Input voltage 1002 may contain an initial rise 1006 to an operating voltage 1008. Input voltage 1002 may then contain one or more stepwise decrease 1010 to intermediate operating voltages 1012. In some examples, each of operating voltage 1008 and intermediate operating voltages 1012 cause an example oscillator circuit to output spike bunches 1016 and 1018 in output current 1004, each operating voltage 1008 or 1012 corresponding to a number of current spikes in each corresponding spike bunch 1016 or 1018.

Output current 1004 may contain an initial spike 1014 corresponding with an initial rise 1006 of input voltage 1002. In some examples, output current 1004 includes a spike train including spike bunches 1016 and 1018 and spike intervals 1020. Spike bunch 1016 may include a single current spike and spike bunches 1018 may include multiple current spikes. In some examples, the number of current spikes in a spike bunch 1016 or 1018 is dependent on the magnitude of input voltage 1002. In certain examples, output current 1004 outputs a spike train when the magnitude of input voltage 1002 is within a range of voltages, and the number of current spikes in each spike bunch 1016 or 1018 increases as input voltage 1002 decreases within the range of voltages. Spike bunches 1016 and 1018 may be separated by spike intervals 1020. In some examples, all spike intervals of output current 1004 are of a substantially similar duration.

Figure 11A:
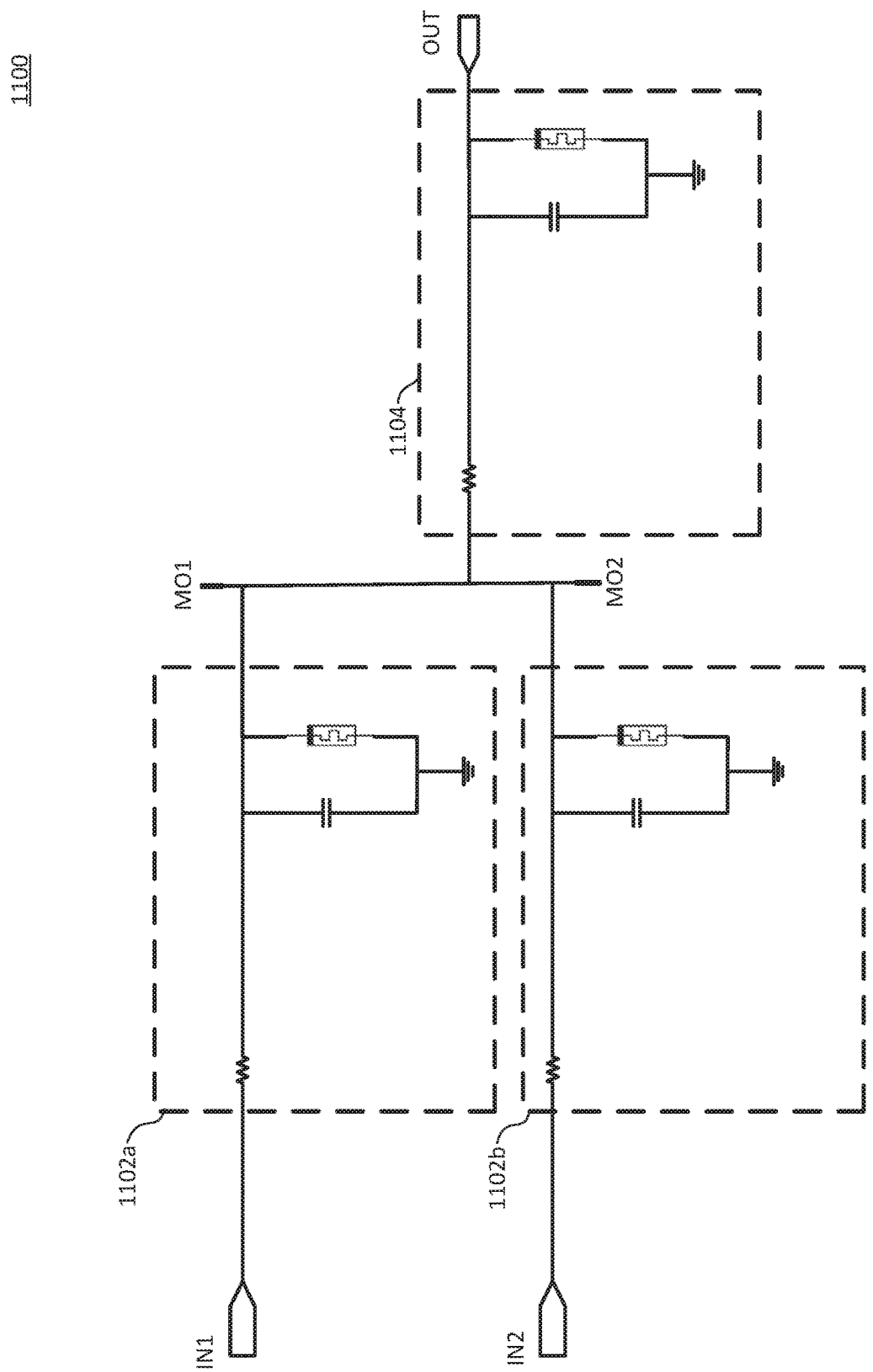
FIG. 11A is an example Boolean logic circuit including example oscillator circuits.

In FIG. 11A, an example Boolean logic circuit is illustrated. Certain portions of the example circuit are labeled (e.g. IN1, MO1, OUT) to allow discussion of performance of the certain portions of the example circuit. In some examples, Boolean logic circuit 1100 includes circuit portions 1102 and 1104. Each circuit portion 1102 or 1104 may be a Pearson-Anson oscillator including a second-order memristor. In some examples, circuit portion 1102a receives a digital input signal at node IN1, circuit portion 1102b receives a digital input signal at node IN2, and circuit portion 1104 outputs a spike bunch corresponding to a digital output signal at node OUT. In some examples, Boolean logic circuit 1100 is a logical "OR" circuit, where output OUT generates a spike bunch when input IN1 receives a digital high signal or when input IN2 receives a digital high signal (or when both input IN1 and input IN2 receive a digital high signal).

In an example operation of an example Boolean logic circuit 1100, a direct current input signal at input IN1 may be received by circuit portion 1102a. Circuit portion 1102a may then output a spike bunch at node MO1 in response to receiving a digital high signal. Similarly, a direct current input signal at input IN2 may be received by circuit portion 1102b. Circuit portion 1102b may then output a spike bunch at node MO2 in response to receiving a digital high signal. Circuit portion 1104 may then receive the spike bunches output from circuit portions 1102a and 1102b. Circuit portion 1104 may then output a spike bunch to output OUT when one or more of circuit portions 1102a and 1102b output a spike bunch corresponding to a digital high input being received at input IN1 and input IN2, respectively.

Figure 11B:
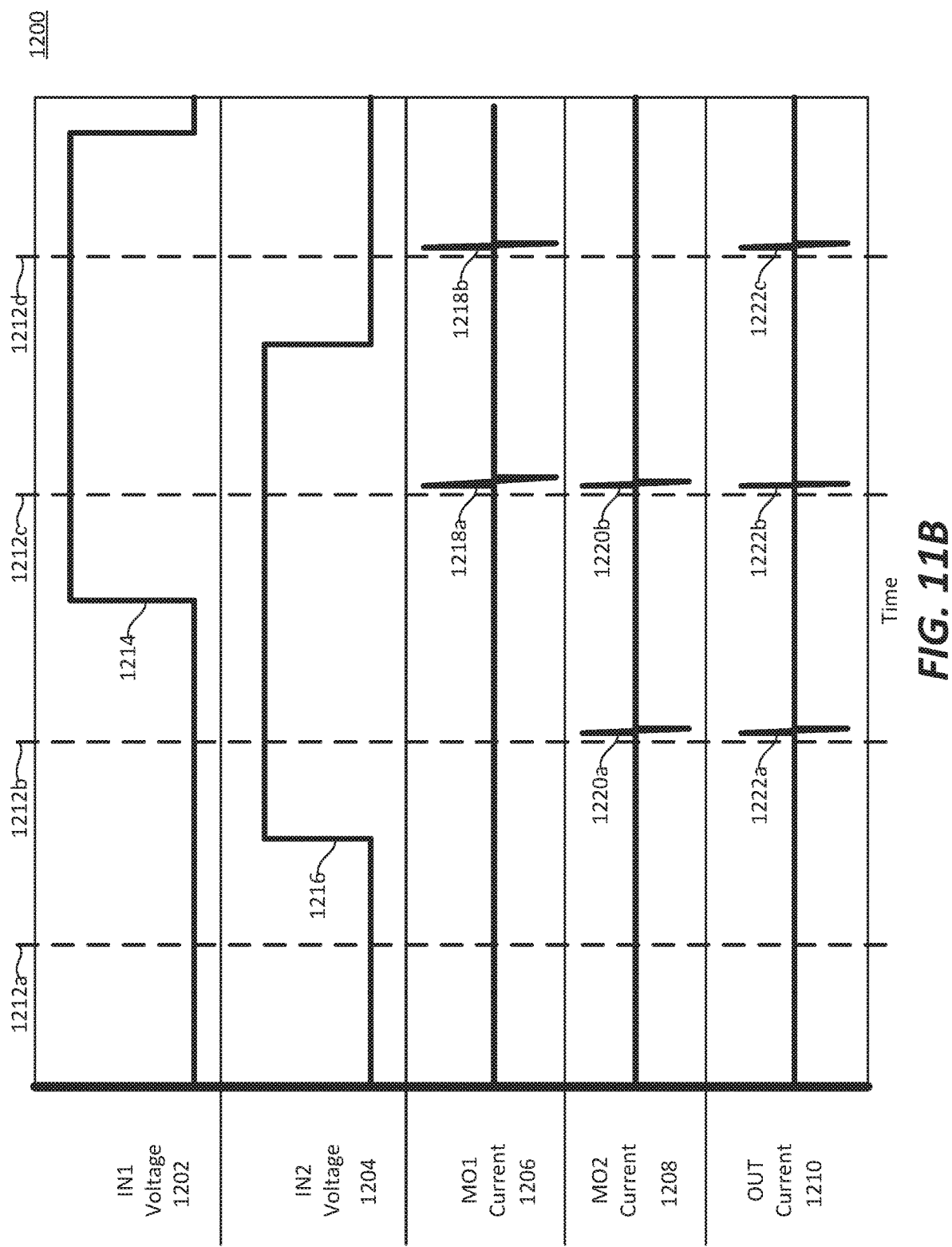
FIG. 11B is a graph illustrating voltages and currents at certain points of an example Boolean logic circuit.

In FIG. 11B, a graph illustrating an example operation of an example Boolean logic circuit is shown. Graph 1200 shows an input voltage 1202 at input IN1, an input voltage 1204 at input IN2, a current 1206 at node MO1, a current 1208 at node MO2, and an output current 1210 at output OUT, corresponding to an example Boolean logic circuit of FIG. 11A. Graph 1200 includes time indicators 1212. Time indicator 1212a may correspond to a point when the input signals 1214 and 1216 at IN1 and IN2, respectively, are both digital low signals. Time indicator 1212b may correspond to a point when input signal 1214 at IN1 is a digital low signal and input signal 1216 at IN2 is a digital high signal. Time indicator 1212c may correspond to a point when input signals 1214 and 1216 are both digital high signals. Time indicator 1212d may correspond to a point when input signal 1214 at IN1 is a digital high signal and input signal 1216 at IN2 is a digital low signal.

In some examples, graph 1200 shows the operation of an example Boolean logic circuit consistent with Boolean logic circuit 1100 of FIG. 11A. Graph 1200 may show the operation of an "OR gate," wherein an output signal at OUT is a spike train when one or more input signals 1214 and 1216 at IN1 and IN2, respectively, is a digital high signal.

At time indicator 1212a, input signal 1214 at IN1 may be a digital low signal, and input signal 1216 at IN2 may also be a digital low signal. Consequently, at time indicator 1212a, current 1206 at node MO1 may be substantially consistent, representing the digital low signal received at IN1. Also, current 1208 at node MO2 may be substantially consistent, representing the digital low signal received at IN2. Current 1210 may also be substantially consistent, representing a logical "OR" of the digital low signals received at IN1 and IN2.

At time indicator 1212b, input signal 1214 at IN1 may be a digital low signal, and input signal 1216 at IN2 may be a digital high signal. Consequently, at time indicator 1212b, current 1206 at node MO1 may be substantially consistent, representing the digital low signal received at IN1. Current 1208 at node MO2 may exhibit a spike bunch 1220a, representing the digital high signal received at IN2. Current 1210 may also exhibit a spike bunch 1222a, representing a logical "OR" of input signals 1214 and 1216 received at IN1 and IN2, respectively.

At time indicator 1212c, input signal 1214 at IN1 may be a digital high signal, and input signal 1216 at IN2 may also be a digital high signal. Consequently, at time indicator 1212b, current 1206 at node MO1 may exhibit a spike bunch 1218a, representing the digital high signal received at IN1. Also, current 1208 at node MO2 may exhibit a spike bunch 1220b, representing the digital high signal received at IN2. Current 1210 may also exhibit a spike bunch 1222b, representing a logical "OR" of the digital high signals received at IN1 and IN2.

At time indicator 1212d, input signal 1214 at IN1 may be a digital high signal, and input signal 1216 at IN2 may be a digital low signal. Consequently, at time indicator 1212d, current 1206 at node MO1 may exhibit a spike bunch 1218b, representing the digital high signal received at IN1. Current 1208 at node MO2 may be substantially consistent, representing the digital low signal received at IN2. Current 1210 may also exhibit a spike bunch 1222c, representing a logical "OR" of input signals 1214 and 1216 received at IN1 and IN2, respectively.

Although the present disclosure has been described in detail, it should be understood that various changes, substitutions and alterations can be made without departing from the spirit and scope of the disclosure. Any use of the words "may" or "can" in respect to features of the disclosure indicates that certain embodiments include the feature and certain other embodiments do not include the feature, as is appropriate given the context. Any use of the words "or" and "and" in respect to features of the disclosure indicates that embodiments can contain any combination of the listed features, as is appropriate given the context.

The invention claimed is:

1. An oscillator circuit comprising:
    a voltage source to supply the oscillator circuit with a direct current input signal;
    a resistor coupled in series with the voltage source;
    a capacitor coupled in series with the resistor and the voltage source; and
    a nonlinear device coupled in parallel with the capacitor, wherein the nonlinear device includes an active layer coupled to a first electrode and a second electrode, and wherein, in response to the direct current input signal, the oscillator circuit outputs a spike train including a spike bunch, wherein the spike bunch comprises a number of current spikes, the number of current spikes based on a magnitude of the direct current input voltage.

2. The oscillator circuit of claim 1, wherein the nonlinear device is a second-order memristor.

3. The oscillator circuit of claim 2, wherein the second-order memristor has a variable resistance based in part on a first operating parameter and a previous state of the first operating parameter, wherein the variable resistance differs at a first value of the first operating parameter based on the previous state of the first operating parameter.

4. The oscillator circuit of claim 3, wherein the variable resistance of the second-order memristor is based in part on a second operating parameter, and wherein a current-voltage (IV) curve representing the variable resistance contains a negative differential resistance region.

5. The oscillator circuit of claim 4, wherein the first operating parameter is a current through the second-order memristor and the second operating parameter is a temperature of the second-order memristor.

6. The oscillator circuit of claim 1, wherein the spike bunch occurs a time after a prior spike bunch, the time determined by a resistance of the resistor, a capacitance of the capacitor, and characteristics of the nonlinear device.

7. A method comprising:
applying a direct current voltage to a circuit such that a voltage across a capacitor increases;
configuring a nonlinear device of the circuit in a first state in which current is substantially prevented from flowing through the nonlinear device;
upon the nonlinear device being configured in the first state and the voltage across the capacitor exceeding a first threshold voltage, configuring the nonlinear device in a second state in which the current flows through the nonlinear device;
upon the nonlinear device being configured in the second state and the voltage across the capacitor reducing below a second threshold voltage, configuring the nonlinear device in the first state, wherein the current is substantially prevented from flowing through the nonlinear device; and
generating, at an output of the circuit and based in part on the current flowing through the nonlinear device, a spike train including a spike bunch, wherein the spike bunch comprises a number of current spikes, the number of current spikes based on a magnitude of the direct current input voltage.

8. The method of claim 7, wherein the current spike comprises an increase in current from an original current to a maximum current, followed by a decrease in current from the maximum current to a minimum current less than the original current, followed by an increase from the minimum current to the original current.

9. The method of claim 7, wherein the nonlinear device is a second-order memristor.

10. The method of claim 9, wherein the second-order memristor has a variable resistance based in part on a first operating parameter and a previous state of the first operating parameter, wherein the variable resistance differs at a first value of the first operating parameter based on the previous state of the first operating parameter.

11. The method of claim 10, wherein a current-voltage (IV) curve representing the variable resistance contains a negative differential resistance region.

12. The method of claim 11, wherein the first operating parameter is a current through the second-order memristor and the second operating parameter is a temperature of the second-order memristor.

13. The method of claim 9, wherein the circuit is a Pearson-Anson oscillator comprising a resistor coupled in series with a capacitor that is coupled in parallel with the second-order memristor.

14. The method of claim 13, wherein the spike bunch occurs a time after a prior spike bunch, the time determined by a resistance of the resistor, a capacitance of the capacitor, and characteristics of the second-order memristor.

15. A Boolean logic gate comprising:
a plurality of Pearson-Anson oscillators, each including a second-order memristor coupled to a capacitor in parallel and coupled to a resistor in series,
wherein each second-order memristor comprises an active layer coupled to a first electrode and a second electrode, and
wherein each second-order memristor is configured in a first state such that current is substantially prevented from flowing through the second-order memristor until a voltage across the respective capacitor exceeds a first threshold, and
wherein upon the second-order memristor being configured in the first state and the voltage across the respective capacitor exceeding the first threshold, the second-order memristor is configured in a second state such that the current flows through the second-order memristor until the voltage across the capacitor is reduced below a second threshold, and
wherein upon the second-order memristor being configured in the second state and the voltage across the capacitor reducing below the second threshold, the second-order memristor is configured in the first state such the current is substantially prevented from flowing through the second-order memristor;
a first input to receive a first direct current input signal; and
an output to generate, based in part on the direct current input signal, a digital output of a first value represented by a spike bunch including a current spike.

16. The Boolean logic gate of claim 15, wherein each second-order memristor has a variable resistance based in part on a first operating parameter and a previous state of the first operating parameter, wherein the variable resistance differs at a first value of the first operating parameter based on the previous state of the first operating parameter.

17. The Boolean logic gate of claim 16, wherein the first operating parameter is a current through the respective second-order memristor and the second operating parameter is a temperature of the respective second-order memristor.

18. The Boolean logic gate of claim 15, further comprising a second input to receive a second direct current input signal, wherein the output is a Boolean "OR" of the first direct current input signal and the second direct current input signal.

19. The Boolean logic gate of claim 15, wherein the current spike comprises a reduction in current from an original current to a minimum current, followed by an increase in current from the minimum current to a maximum current greater than the original current, followed by a decrease from the maximum current to the original current.

20. The Boolean logic gate of claim 18, wherein the first direct current input signal represents a digital input of a second value and the second direct current input signal represents a digital input of the second value, and the output generates a digital output of the second value represented by a substantially consistent output current.

* * * * *